(12) United States Patent
Su

(10) Patent No.: US 9,362,120 B2
(45) Date of Patent: Jun. 7, 2016

(54) LITHOGRAPHY PROCESS AND COMPOSITION WITH DE-CROSSLINKABLE CROSSLINK MATERIAL

(71) Applicant: Taiwan Semiconductor Manufacturing Company, Ltd., Hsin-Chu (TW)

(72) Inventor: Yu-Chung Su, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/537,347

(22) Filed: Nov. 10, 2014

(65) Prior Publication Data

US 2015/0279660 A1 Oct. 1, 2015

Related U.S. Application Data

(60) Provisional application No. 61/973,031, filed on Mar. 31, 2014.

(51) Int. Cl.
| | | |
|---|---|---|
| G03F 7/004 | (2006.01) | |
| H01L 21/027 | (2006.01) | |
| G03F 7/40 | (2006.01) | |
| G03F 7/16 | (2006.01) | |
| G03F 7/09 | (2006.01) | |

(52) U.S. Cl.
CPC ............ *H01L 21/0274* (2013.01); *G03F 7/091* (2013.01); *G03F 7/162* (2013.01); *G03F 7/168* (2013.01); *G03F 7/40* (2013.01); *H01L 21/0276* (2013.01)

(58) Field of Classification Search
CPC ....... G03F 7/091; G03F 7/40; H01L 21/0274; H01L 21/0276

USPC ........................ 430/271.1, 322, 330, 331, 317
See application file for complete search history.

(56) References Cited

U.S. PATENT DOCUMENTS

| | | | |
|---|---|---|---|
| 5,489,451 A * | 2/1996 | Omeis ..................... | C09B 69/10 252/299.01 |
| 5,886,102 A | 3/1999 | Sinta et al. | |
| 5,973,036 A * | 10/1999 | Matzinger .............. | C09D 11/34 106/31.13 |
| 6,492,092 B1 | 12/2002 | Foster et al. | |
| 7,993,810 B2 | 8/2011 | Choi et al. | |
| 8,088,548 B2 | 1/2012 | Houlihan et al. | |
| 8,383,870 B2 * | 2/2013 | Knight .................... | F01K 13/00 48/197 R |
| 8,445,187 B2 | 5/2013 | Yoon et al. | |
| 8,481,247 B2 | 7/2013 | Horiguchi et al. | |
| 8,524,851 B2 | 9/2013 | Kim et al. | |
| 8,574,815 B2 * | 11/2013 | Coady ................... | G03F 7/0002 430/270.1 |

(Continued)

OTHER PUBLICATIONS

Aldrich, N. K. Lau et al., New Thermal Cross-Linkers Based on Triazene: Cross-Linking of Fluorinated Polyimides and Aromatic Polymers, Macromolecules 1992, 25, Jun. 17, 1992, 7294-7299.

*Primary Examiner* — Amanda C Walke
(74) *Attorney, Agent, or Firm* — Haynes and Boone, LLP

(57) ABSTRACT

The present disclosure provides a method that includes forming a polymeric material layer on a substrate, wherein the polymeric material layer includes de-crosslinkable crosslink material (DCM); performing a first baking process having a first baking temperature to the polymeric material layer, thereby initiating crosslinking function of the DCM; and performing a second baking process having a second baking temperature to the polymeric material layer, thereby initiating de-crosslinking function of the DCM.

20 Claims, 9 Drawing Sheets

(56) References Cited

U.S. PATENT DOCUMENTS

| | | | | |
|---|---|---|---|---|
| 2002/0160299 A1* | 10/2002 | Asawa | B41C 1/1008 | 430/270.1 |
| 2003/0129506 A1* | 7/2003 | Pappas | B41C 1/1008 | 430/9 |
| 2004/0018451 A1* | 1/2004 | Choi | G03F 7/091 | 430/313 |
| 2007/0054969 A1* | 3/2007 | Bailey | C08F 230/04 | 521/40 |
| 2007/0148465 A1* | 6/2007 | Shimura | C08G 63/08 | 428/411.1 |
| 2007/0207406 A1 | 9/2007 | Guerrero et al. | | |
| 2013/0172480 A1* | 7/2013 | Schmidt | C08J 3/24 | 524/560 |
| 2013/0280656 A1* | 10/2013 | Lowes | G03F 7/091 | 430/280.1 |

* cited by examiner

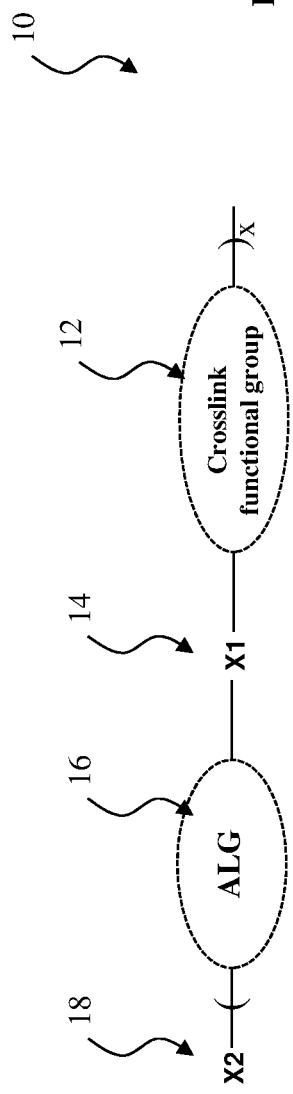
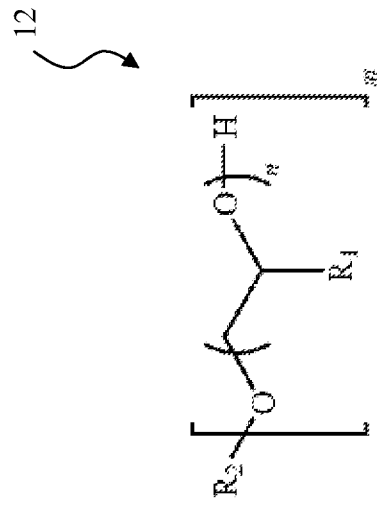
Fig. 1
Fig. 2

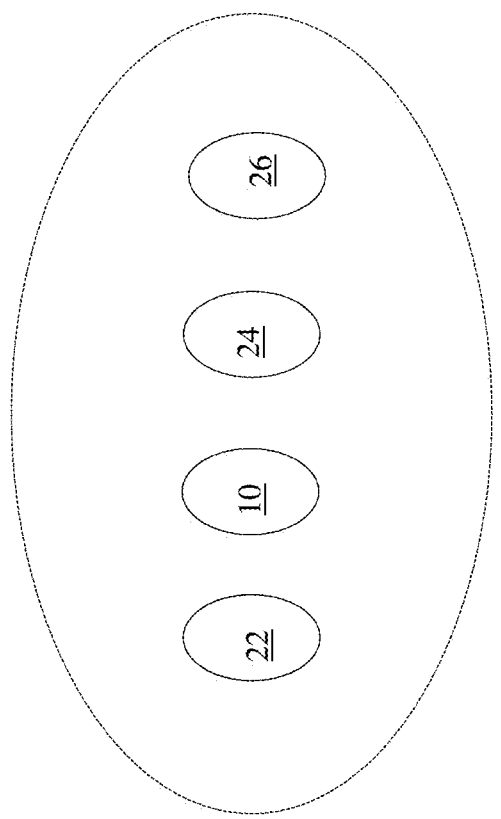

LITHOGRAPHY PROCESS AND COMPOSITION WITH DE-CROSSLINKABLE CROSSLINK MATERIAL

BACKGROUND

This application claims the benefit of U.S. Ser. No. 61/973,031, filed Mar. 31, 2014, entitled "Lithography Process And Composition With De-Crosslinkable Crosslink Material," the entire disclosure of which is hereby incorporated herein by reference.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing, such as lithography process, are needed. During a lithography process, etching is employed to remove one or more materials. However, the existing etch method will damage the substrate.

Therefore, a method of lithography process and a structure of a coating material utilized in the lithography process are desired to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic view of a de-crosslinkable crosslink material (DCM), constructed in accordance with some embodiments.

FIG. 2 illustrates a crosslink functional group in the DCM of FIG. 1, constructed in accordance with some embodiments.

FIG. 6 is a schematic view of a polymeric material, constructed in accordance with some embodiments.

DETAILED DESCRIPTION

Figure 3A:
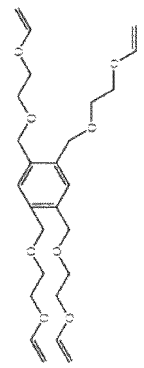
FIGS. 3A through 3F illustrate a crosslink functional group in the DCM of FIG. 1, constructed in accordance with various embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a schematic view of a de-crosslinkable crosslink material (DCM) 10 in accordance with some embodiments. The DCM 10 functions to both crosslink and de-crosslink upon proper conditions. In some embodiments, the DCM functions to crosslink, such as polymeric backbones, in response to a first baking process having a first baking temperature. In furtherance of the embodiments, the DCM functions to de-crosslink, such as the polymeric backbones, in response to a second baking process having a second baking temperature different from the first baking temperature. In the present embodiment, the second baking temperature is greater than the first baking temperature so that the first baking process only trigs the crosslinking but does not trig the de-crosslinking.

In a particular embodiment, the minimum baking temperature to turn on the crosslinking mechanism of the DCM is Tc and the minimum baking temperature to turn on the de-crosslinking mechanism of the DCM is Td. Td is greater than Tc. Therefore, the first baking temperature is equal to or greater than Tc but less than Td. The second baking temperature is greater than Td. In some embodiments, the first or second baking process has a baking duration ranging from about 10 seconds to about 10 minutes. In some embodiments, the first or second baking process has a baking temperature ranging from about 70 degree to about 330 degree.

As illustrated in FIG. 1, the DCM 10 includes a crosslink functional group 12 that functions to crosslink for polymerization. The crosslink functional group 12 can be initiated to crosslink for polymerization. In some embodiments, the crosslink functional group 12 includes a chemical structure illustrated in FIG. 2. Some other embodiments of the crosslink functional group 12 are illustrated in FIGS. 3A-3F, respectively. Some of them are described in US patent application 2007/0207406 and a journal article titled "New thermal crosslinkers based on triazene: crosslinking of fluorinated polyimides and aromatic polymers" by Aldrich N. K. Lau, Lanchi P. Vo (Macromolecules, 1992, 25 (26), pp 7294-7299), the entire disclosures of which are hereby incorporated herein by reference.

Particularly in FIG. 3A, the chemical group R1 may include an alkyl group with hydrogen attached of hydrocarbon in a straight, branched, or cyclic structure. The alkyl group may also include a hetero atom. For example, the alkyl group may further include nitrogen, or oxygen. In other examples, R1 may include at least one of hydroxyl, carboxyl, amine, amide group, alkyl, fluoro, and benzyl group. In some embodiment where the DCM 10 or the polymeric material having the DCM is modified as a floating structure (as described later), R1 includes fluorine atom or alkyl fluoride. For examples, at least one of the alkyl groups includes $CF_3$, $C_2F_5$, or $C_3F_7$. The chemical group R2 may include at least one of hydroxyl, carboxyl, amine, amide group, alkyl, fluoro, and benzyl group. For the floating consideration, R2 may include at least one of fluorine atom and alkyl fluoride. For example, at least one of the alkyl groups includes $CF_3$, $C_2F_5$, or $C_3F_7$.

Figure 3B:
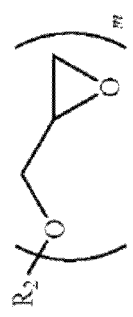
Figure 3C:
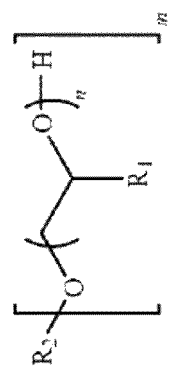
Figure 3D:
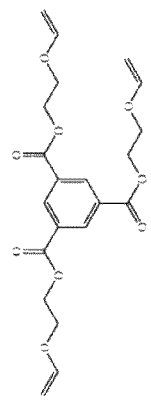
Figure 3E:
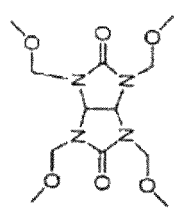
Figure 3F:
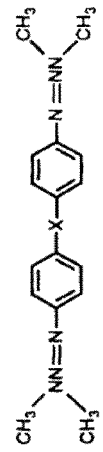

In FIG. 3B, the chemical group R2 may include an alkyl group with hydrogen attached of hydrocarbon in a straight, branched, or cyclic structure. The alkyl group may also include a hetero atom. In some examples, the alkyl group may further include nitrogen, oxygen, fluorine atom, or alkyl fluoride. The glycidyl ether in the crosslink functional group 12 in FIG. 3B may alternatively be replaced by alkyl oxide, alkene, alkyne, triazene, or other crosslinkable functional group. In another example, the crosslink group may further include other atom, such as silicon, attached to the chemical group R2.

The DCM 10 further includes a first chemical structure 14 that is represented by "X1" in FIG. 1. The first chemical structure 14 is chemically bonded to the crosslink functional group 12. In some embodiments, the first chemical structure 14 includes at least one of hydroxyl, carboxyl, amine, amide group, alkyl, fluoro, benzyl group. In some other embodiments, the first chemical structure 14 includes at least one of fluorine atom or alkyl fluoride. For example, the first chemical structure 14 includes at least one alkyl group that further includes $CF_3$, $C_2F_5$, $C_3F_7$ or a combination thereof.

Figure 4:
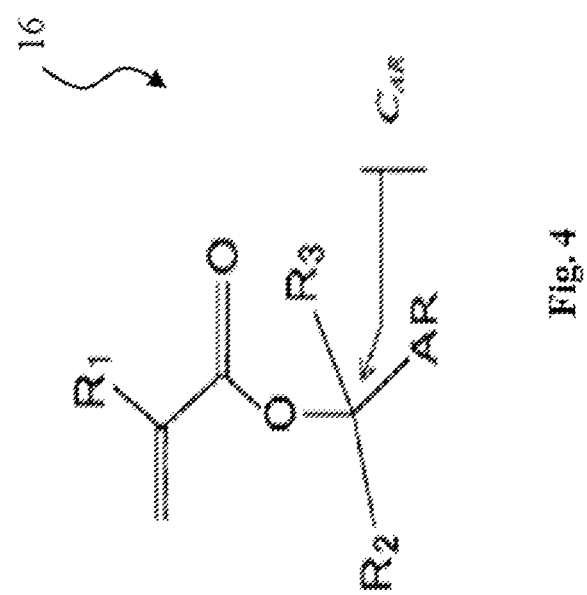
FIG. 4 illustrates an acid labile group in the DCM of FIG. 1, constructed in accordance with some embodiments.

The DCM 10 further includes an acid labile group (ALG) 16 chemically bonded to the first chemical structure 14, as illustrated in FIG. 1. The ALG 16 is unstable in acid presence and therefore functions to de-crosslink. In some embodiments, the ALG 16 includes a chemical structure as illustrated in FIG. 4, such as one described in U.S. Pat. No. 7,993,810, the entire disclosure of which is incorporated herein by reference.

Still referring to FIG. 4, the ALG 16 is further described. In some embodiments, the chemical structure $R_1$ is hydrogen or methyl. In some other embodiments, the chemical structure $R_2$ is hydrogen, a substituted or unsubstituted alkyl, or a substituted or unsubstituted aryl. In some embodiments, the chemical structure $R_3$ is hydrogen, a substituted or unsubstituted alkyl, or a substituted or unsubstituted aryl. In some other embodiments, AR is a substituted or unsubstituted phenyl ring, or a substituted or unsubstituted aryl having from two to four fused aromatic rings, and carbon $C_{AR}$ may be bonded directly to an aromatic ring of AR. In some other embodiments, AR includes first and second aromatic rings, the first and second aromatic rings being fused together, the first aromatic ring may have a chemical group that is hydrogen, a halogen, an alkyl, or an alkoxy, and the second aromatic ring may have another chemical group that is hydrogen, a halogen, an alkyl, or an alkoxy. In some embodiments, at least one of $R_2$ and $R_3$ is an alkyl, an alkyl having an alkoxy substituent, an aryl, or an aryl having an alkoxy substituent.

Still referring to FIG. 1, the crosslink functional group 12 and the ALG 16 are coupled together through the chemical structure 14 into a chemical segment. In some embodiments, this chemical segment may be repeated multiple times, such as x times where x is an integer.

The DCM 10 may further include another chemical structure 18, represented by "X2" in FIG. 1. The chemical structure 18 is chemically bonded to the ALG 16. In some embodiments, the chemical structure 18 includes an alkyl group with a hydrogen attached hydrocarbon. In some other embodiments, the chemical structure 18 includes a straight structure, a branched structure, a cyclic structure, or a combination thereof. The alkyl group may also include hetero atom. For example, the chemical structure 18 further includes nitrogen or oxygen. In other embodiments, the chemical structure 18 includes at least one of hydroxyl, carboxyl, amine, amide group, alkyl, fluoro, benzyl group.

In some other embodiments, the DCM 10 is a floating structure. The floating structure means that the DCM as a component of a polymeric solution is able to float to the top portion of the polymeric solution, such as when the polymeric solution is coated on a substrate. In furtherance of the embodiments, the chemical structure X1 or X2 includes at least one of fluorine atom or alkyl fluoride. For example, X1 or X2 includes at least one of the alkyl group that further includes $CF_3$, $C_2F_5$, or $C_3F_7$. In other embodiments, the DCM 10 is floatable by design according to other factors, such as polarity, solvent, molecular weight, specific gravity, or a combination thereof.

Figure 5:
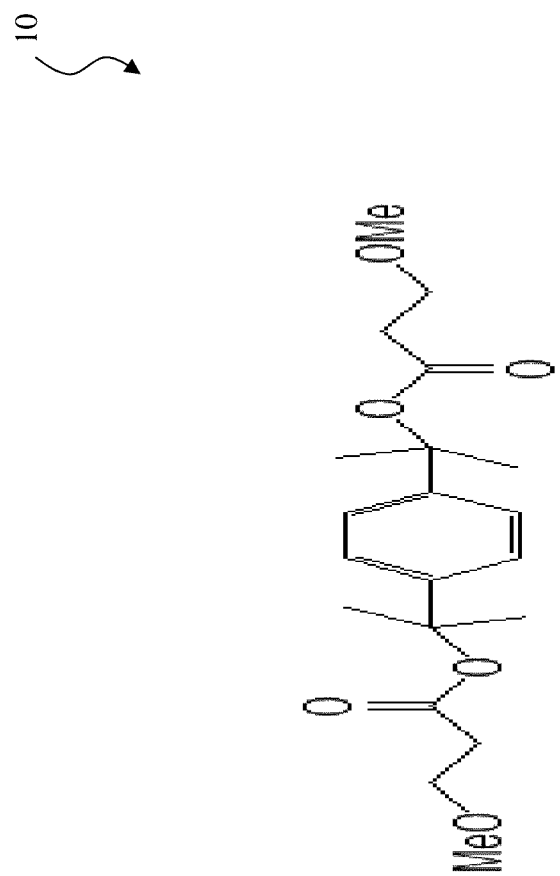
FIG. 5 illustrates a chemical structure of the DCM, constructed in accordance with some embodiments.

In some alternative embodiments, X1 may include other chemical structure that is capable of chemically bonding to both the crosslink functional group 12 and the ALG 16. In some alternative embodiments, X2 may include other chemical structure that is capable of chemically bonding to polymeric backbones and the ALG 16. In some embodiments, the DCM 10 includes a chemical structure as illustrated in FIG. 5.

In some embodiments, the DCM 10 is used in a polymeric material for semiconductor fabrication. The polymeric material may be coated on a semiconductor substrate (such as a wafer) for various fabrication purposes. The polymeric material is a liquid at the initial stage and can be coated on a substrate by a suitable method, such as spin-on coating.

Figure 7:
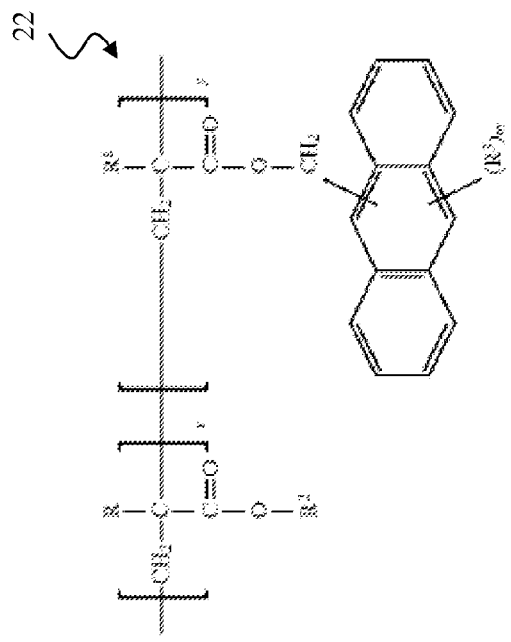
FIG. 7 illustrates a polymeric backbone in the polymeric material of FIG. 6, constructed in accordance with some embodiments.

FIG. 6 is a diagrammatical view of a polymeric material 20 having DCM 10, constructed in accordance with some embodiments. The polymeric material 20 includes a plurality of polymeric backbones 22 that function as building block to form a macromolecular polymer when being crosslinked together during a polymerization process. Particularly, the polymeric backbone 22 is capable to chemically react with the DCM 10. In some embodiments, the polymeric backbone 22 includes pendant anthracyl groups. In some embodiments, the polymeric backbone 22 includes a chemical structure with its formula illustrated in FIG. 7, such as described by U.S. Pat. No. 5,886,102, the entire disclosure of which is incorporated herein by reference. Here some chemical structures are represented by similar symbols, such as R, $R^1$, $R^2$ and $R^3$. However, the corresponding structures are respectively described below. The chemical structure of each of R and $R^1$ is independently a hydrogen or a substituted or unsubstituted alkyl group having from 1 to about 8 carbon atoms. For example, the chemical structure R or $R^1$ includes a substituted or unsubstituted $C_{1-6}$ alkyl. In some embodiments, each $R^2$ is independently substituted or unsubstituted alkyl having 1 to about 10 carbon atoms, or 1 to about 6 carbons in typical examples. Each $R^3$ may be independently halogen (such as F, Cl and Br), alkyl having 1 to about 8 carbon atoms, alkoxy having 1 to about 8 carbon atoms, alkenyl having 2 to about 8 carbon atoms, alkynyl having 2 to about 8 carbon atoms, cyano, or nitro. The symbol m is an integer ranging between 0 (where the anthracyl ring is fully hydrogen-substituted) and 9, such as between 0 and 2 in some examples. The symbol x is the mole fraction or percent of alkyl acrylate units in the polymer and may range from about 10 to about 80 percent in some embodiments. The symbol y is the mole fraction or percent of anthracene units in the polymer and may range from about 5 to 10 to 90 percent in some embodiments. In some embodiments, the polymeric backbone 22 may include other chemical units, such as 9-(methylene) anthracene ester units.

The polymeric material 20 further includes the DCM 10 mixed with the polymeric backbones 22. The DCM 10 in the polymeric material 20 includes a plurality of DCM molecules as illustrated in FIG. 1. The DCM 10 is designed to include the crosslink functional group 12 that is capable of crosslinking the polymeric backbones 22 to form polymer when being initiated, such as by the first baking process with the first baking temperature. Additionally, the DCM 10 is designed to include the ALG 16 that is capable of de-crosslinking the polymer when being initiated, such as by the second baking process with the second baking temperature.

In some embodiments, the DCM 10 is capable of floating to the top portion of the polymeric material 20 through various mechanisms, such as polarity, solvent, specific gravity or other proper factors. For example, at least one of X1 and X2 in the DCM 10 includes fluorine atom or alkyl fluoride.

The polymeric material 20 also includes catalyst 24 mixed with the polymeric backbones 22 and the DCM 10. The catalyst 24 functions to provide an acid environment to the ALG 16 so that the de-crosslinking mechanism of the ALG can be initiated in the proper condition, such as during the second baking process with the second baking temperature. In some embodiments, the catalyst 24 is a thermal acid generator that is capable of generating acids in proper thermal activation, such as in a baking process with a certain baking temperature. In some other embodiments, the catalyst 24 and the second baking process may combine to provide acid to the ALG 16 for de-crosslinking through other suitable mechanism.

Figure 8:
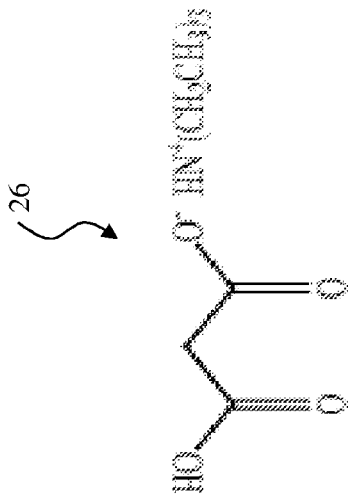
FIGS. 8-10 illustrate catalyst in the polymeric material of FIG. 6, constructed in accordance with some embodiments.
Figure 10:
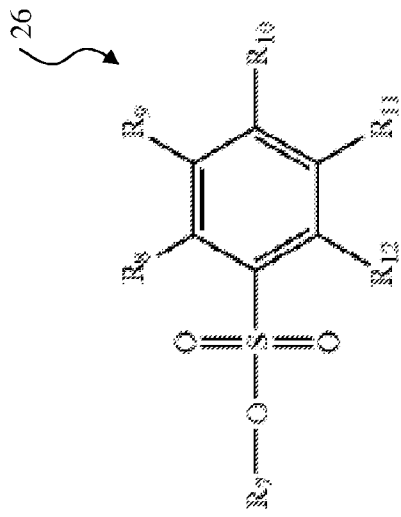
Figure 9:
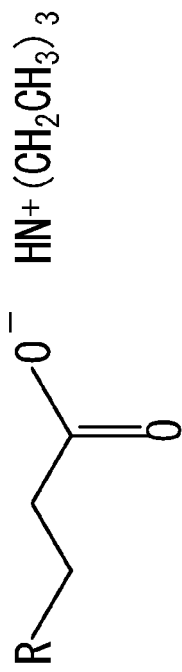

The catalyst 24 is illustrated in FIGS. 8-10 in accordance with some embodiments. The catalysts described in U.S. Pat. Nos. 8,088,548 and 6,492,092 are incorporated herein by reference.

The polymeric material 20 further includes a solvent 26 such that the polymeric backbones 22, the DCM 10 and the catalyst 24 are dissolved therein. Therefore, the polymeric material is a solution or in a liquid state at the initial stage (before thermal baking). In some embodiments, the solvent 26 includes Propylene Glycol Methyl Ether (PGME), propylene glycol methyl ether acetate (PGMEA), PGEE, GBL, NMP, NBA, MAK, EL, MIBC, alcohol, IPA, ethanol, or other suitable solvent.

The polymeric material 20 may further include other component for tuning characteristics of the polymeric material 20. In some embodiments, the polymeric material 20 include a chromophore functional group. In various examples, the chromophore includes benzene, Naphthalene, Anthracene, or Phenanthrene functional group.

In some embodiments, the polymeric material 20 include a surface energy modifying functional group to enhancing the gap-filling capability of the polymeric material when it is coated on a substrate having trenches or holes of high aspect ratios. In one example, the surface energy modifying functional group may directly present in the polymeric material 20 as another component. In another example, the surface energy modifying functional group may bond to the polymeric backbone and present as a portion of the polymeric backbone. In another example, the surface energy modifying functional group may bond to and be incorporated into the DCM 10.

In some examples, the surface energy modifying functional group includes at least one of hydroxyl, carboxyl, amine, amide group for increasing surface energy. For example, the functional group has a structure illustrated below,

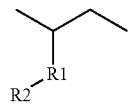

In the above surface energy modifying functional group, R1 is an alkyl group with hydrogen attached of hydrocarbon with straight, branched, or cyclic structure. The alkyl group may include hetero atom. The alkyl group may further include nitrogen, or oxygen. In some examples, R2 includes at least one of hydroxyl, carboxyl, amine, amide group for creasing surface energy. In some other examples, R2 includes at least one of alkyl, fluoro, benzyl group for decreasing surface energy.

Figure 11:
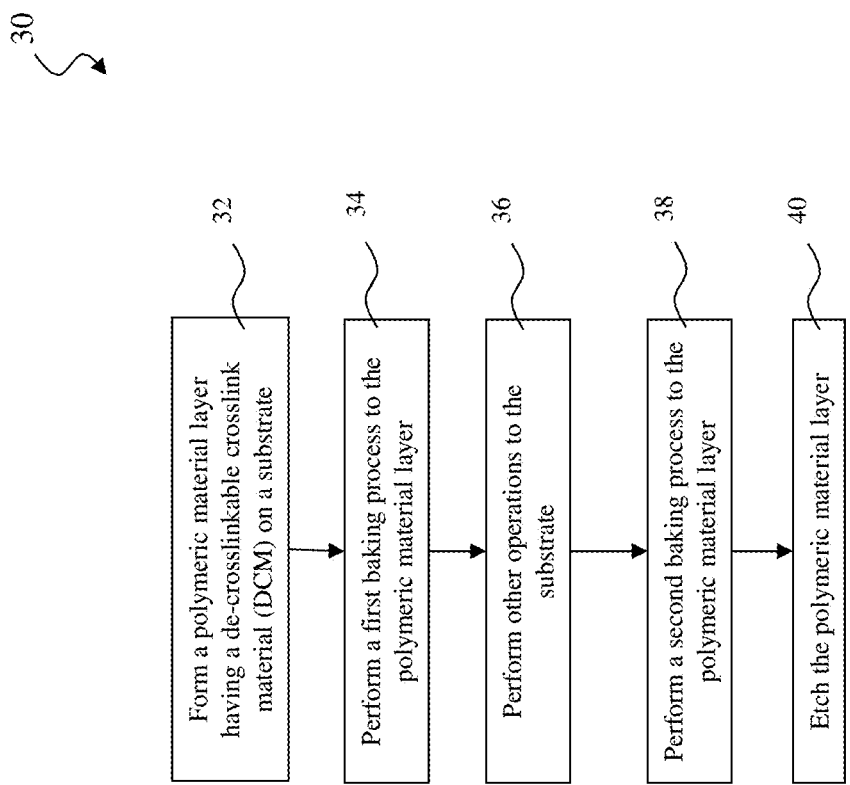
FIG. 11 is a flowchart of a method for utilizing the polymeric material of FIG. 6 in a semiconductor fabrication, constructed in accordance with some embodiments.

FIG. 11 illustrates a flowchart of a method 30 to utilize the DCM 10 and the polymeric material 20 in the semiconductor fabrication, constructed in accordance with some embodiments. FIGS. 12A through 12D are sectional views of a semiconductor structure 50 in accordance with some embodiments. The method 30 is described below with reference to FIGS. 11-12 and other figures.

Figure 12A:
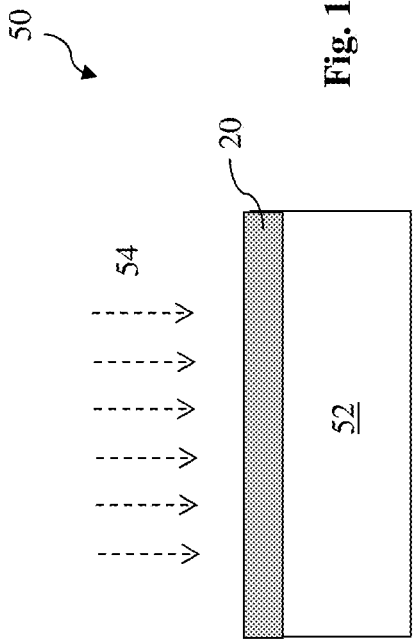
FIGS. 12A through 12E illustrate sectional view of a semiconductor structure at various fabrication stages, constructed in accordance with some embodiments.

Referring to FIGS. 11 and 12A, the method 30 begins an operation 32 by forming a polymeric material layer 20 on a substrate 52. In present embodiment, the substrate 52 is a semiconductor substrate, such as a semiconductor wafer. In some embodiment, the substrate 52 includes silicon. In some other embodiments, the substrate 52 may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), and gallium indium phosphide (GaInP). The substrate 52 may include other features formed before implementing the method 30. For example, the substrate 52 includes various doped features, such as source, drain, and well features. For another example, the substrate 52 includes various dielectric features, such as shallow trench isolation (STI) and multilevel interconnects. In other embodiments, the substrate 52 may alternatively be a non-semiconductor material such as a glass substrate for thin-film-transistor liquid crystal display (TFT-LCD) devices.

In the operation 32, the formation of the polymeric material layer 20 utilizes a suitable technique, such as spin-on coating. At this stage, the polymeric material layer 20 is still a solution (in a liquid state). As described above, the polymeric material 20 includes DCM 10, polymeric backbones 22, catalyst 24 and solvent 26.

As described in FIG. 1, the DCM 10 includes a crosslink functional group 12 and an ALG 16 chemically bonded through a chemical structure 14. The DCM 10 further includes another chemical structure 18 that is capable of bonding to the polymeric backbones. Similarly, another end of the crosslink functional group 12 is also capable of bonding to the polymeric backbones.

In some embodiments, the DCM 10 is designed to float on the top portion of the polymeric material layer 20 through a proper mechanism, such as polarity, solvent, specific gravity or a combination thereof. Thus, there is enough concentration of the DCM 10 on the top portion such that the polymeric material layer 12 at later stage will form a polymerized surface strong enough to prevent inter-diffusion or other issues between the polymeric material layer 20 and an overlying material layer.

In some embodiments, the substrate 52 may have a surface profile. For example, the substrate 52 includes a plurality of fin-like active regions, a plurality of gate stacks, or a plurality of metal lines. In this case, the polymeric material layer 20 is capable of substantially filling in the gaps, holes or trenches of the substrate 52 without forming voids therein. In other examples, the polymeric material layer 20 fills in the gaps, holes or trenches of the substrate 52 with bubbles therein but the bubble size is less than 5 nm. In some examples, the space between the holes or trenches of the substrate 52 is less than 20 nm.

Figure 12B:
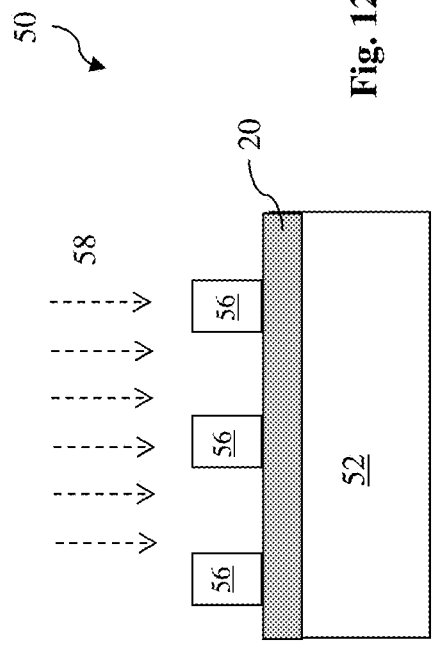

The method 30 includes an operation 34 by performing a first baking process to the polymeric material layer 20, thereby crosslinking the polymeric backbones into polymer. The first baking process 54, as illustrated in FIG. 12B, includes the first baking temperature high enough to initiate the crosslinking mechanism of the crosslink functional group 12 and low enough not to initiate the de-crosslinking mechanism of the ALG 16. State differently with the terms Tc and Td(>Tc) defined above, the first baking temperature T1 is in a range between Tc and Td, being formulated as Tc≤T1<Td.

The method 30 may include one or more other fabrication operations applied to the substrate 52 after the first baking process 54 at operation 34. In some embodiments, the method 30 includes an operation 36 applied to the substrate 52 between the first baking process and a second baking process.

Figure 12C:
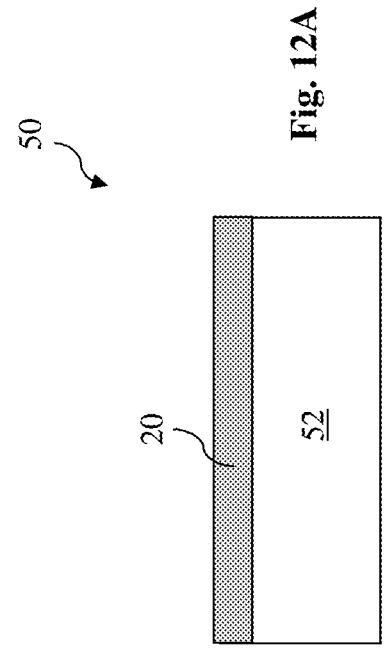

In some embodiments, the operation 36 forms a patterned resist layer 56 on the polymeric material layer 20, as illustrated in FIG. 12C. The patterned resist layer 56 is formed by a lithography procedure. For example, the formation of the patterned resist layer may include resist coating, exposure and developing. Since the polymeric material layer 20 is already polymerized at this stage, the polymeric material layer 20 will not intermix with the coated resist layer. In some embodiments where a floating strategy is employed, at least a top portion of the polymeric material layer is polymerized, thereby effectively preventing the intermixing between the polymeric material layer 20 and the coated resist layer.

Figure 12D:
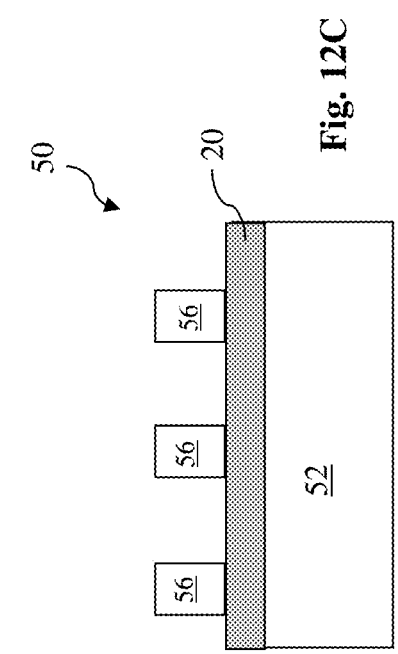

The method 30 also includes an operation 38 by performing a second baking process to the polymeric material layer 20, thereby de-crosslinking the polymerized polymeric material layer 20. In the present embodiment, the portions of the polymeric material layer 20 within the openings of the patterned resist layer 56 are de-crosslinked. The second baking process 58, as illustrated in FIG. 12D, includes the second baking temperature high enough to initiate the de-crosslinking mechanism of the ALG 16. Particularly, the second baking temperature equals to or greater than Td.

The method 30 may also include other operations after the second baking process at the operation 38. In some embodiments, the method 30 includes an operation 40 applied to the polymeric material layer 20 after the second baking process 58. Since the polymeric material layer 20 is de-crosslinked, the operation 40 applied to the de-crosslinked polymeric material layer 20 may gain some advantages.

In some embodiments, the operation 40 includes applying an etching process to the polymeric material layer 20. The etching process removes portions of the polymeric material layer 20 uncovered by the patterned resist layer 56. The patterned resist layer 56 and the polymeric material layer 20 are chosen such that the corresponding etching process has an etch selectivity therebetween. In the present example, the etching process selectively removes the polymeric material layer 20 without etching or minimized etching effect to the patterned resist layer 56. When the etching process is strong, it may damage the substrate 52. With the de-crosslinked polymeric material layer 20, the etching process is able to be chosen with a reasonable etching effect without damage to the substrate 52 but is still capable of removing the polymeric material layer 20 since it is de-crosslinked and is easier to be removed. In other words, the etch rate of the etching process to the polymeric material layer 20 is substantially greater than the etch rate to the substrate.

Figure 13:
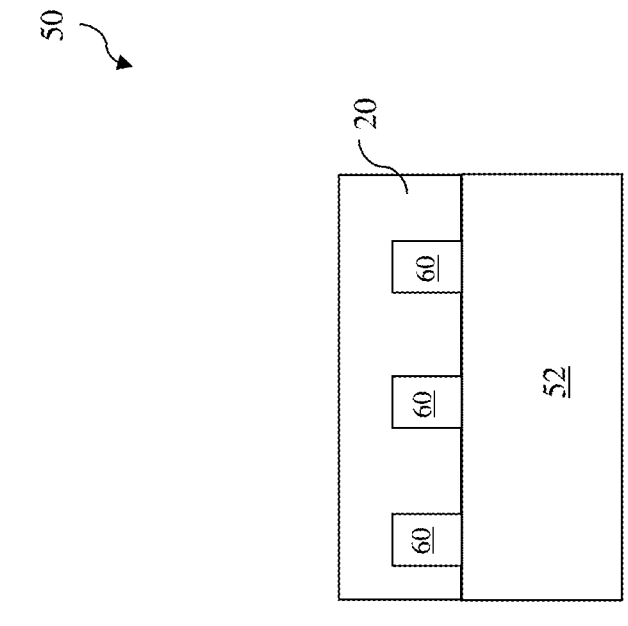
FIG. 13 illustrates a sectional view of a semiconductor structure at a fabrication stage, constructed in accordance with some embodiments.
Figure 12E:
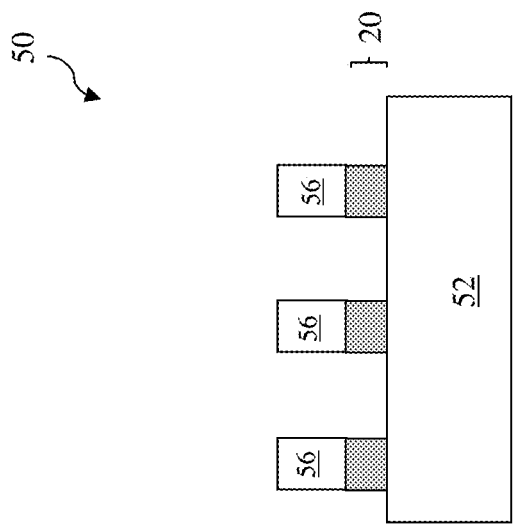

The operation 40 may include other fabrication process, such as removing the patterned resist layer 56 by wet stripping or plasma ashing. Other operations may be implemented before, during and/or after the method 30. For example, the fin-link active regions 60 may be formed on the substrate before the operation 32, such as illustrated in FIG. 13. In this case, the polymeric material layer 20 is coated on the substrate 52 and substantially fills in the trenches between the fin-like active regions 60. Other operations of the method 30 are performed subsequently. In some other examples, the substrate 52 in FIG. 12A may include other circuit pattern, such as trenches or holes formed in a deposited material layer or in a semiconductor material of the substrate 52.

In another example, the lithography process to form the patterned resist layer 56 may further include one or more baking steps, such as soft-baking, post-exposure baking or hard baking. In furtherance of the example, each of those baking steps has a baking temperature less than Td. Alternatively, one of those baking steps, such as hard baking after the developing of the resist layer, may have a baking temperature greater than Td. Thus, the second baking process at operation 38 is combined with this baking step.

The method 30 and the semiconductor structure 50 are only examples to illustrate a method to utilize the disclosed polymeric material 20 having DCM 10 in semiconductor fabrication. However, the polymeric material 20 and the DCM 10 may be employed in the semiconductor fabrication in other embodiments without departure of the disclosed scope. For example, polymeric material layer 20 may be used as an ion implantation mask. An ion implantation process is applied to the substrate through the openings of the polymeric material layer 20.

In another example, the polymeric material layer 20 may function as second resist layer. Disclosed method provides a mechanism to prevent the two resist layers from intermixing and the DCM 10 further provides a mechanism to easily remove or pattern the polymeric material layer 20 without damage to underlying substrate or overlying material (such as overlying first resist layer). In this case, the polymeric material layer 20 further includes photo-sensitive component, such as photo-acid generator.

The present disclosure provides a method utilizing a polymeric material having a de-crosslinkable crosslink material (DCM) for semiconductor fabrication. The DCM includes an acid labile group and a crosslink functional group chemically bonded together. The DCM is capable of crosslinking to form a polymer in response to a first baking process with a first baking temperature ranging from Tc to Td. The DCM is also capable of de-crosslinking the polymer in response to a second baking process with a second baking temperature equal to or greater than Td. Td is greater than Tc. The polymeric material further includes a plurality of polymeric backbones and a catalyst.

The embodiments of the present disclosure offer advantages over existing art, though it is understood that other embodiments may offer different advantages, not all advantages are necessarily discussed herein, and that no particular advantage is required for all embodiments. By the disclosed materials and method, the polymeric material can be tuned for crosslinking or de-crosslinking at different fabrication stages, such as by respective thermal baking. Therefore, the polymeric material is capable of its functions during different operations at different fabrication stages without unexpected concerns, such as damaging to substrate or intermixing with other material layer.

Thus, the present disclosure also provides a method in accordance with some embodiments. The method includes forming a polymeric material layer on a substrate. The polymeric material layer includes de-crosslinkable crosslink material (DCM). The method further includes performing a first baking process having a first baking temperature to the polymeric material layer, thereby initiating crosslinking function of the DCM; and performing a second baking process having a second baking temperature to the polymeric material layer, thereby initiating de-crosslinking function of the DCM.

The present disclosure also provides a method for semiconductor fabrication in accordance with some embodiments. The method includes coating a polymeric material on a semiconductor substrate. The polymeric material includes polymeric backbones; and de-crosslinkable crosslink material (DCM) responsive to thermal baking for crosslinking and de-crosslinking. The DCM includes a crosslink functional group and an acid labile group (ALG) bonded together by a chemical group. The polymeric material further includes a catalyst that is capable of providing an acid environment to the ALG during the second baking process.

The present disclosure provides a method in accordance with some other embodiments. The method includes forming a polymeric material layer on a semiconductor substrate, wherein the polymeric material layer includes de-crosslinkable crosslink material (DCM); performing a first baking process having a first baking temperature to the polymeric material layer, thereby initiating crosslinking function of the DCM; and performing a second baking process having a second baking temperature to the polymeric material layer, thereby initiating de-crosslinking function of the DCM. The second baking temperature is greater than the first baking temperature. The DCM includes a crosslink functional group; an acid labile group; and a chemical group chemically bonded with the crosslink functional group and the acid labile group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a polymeric material layer on a substrate, wherein the polymeric material layer includes de-crosslinkable crosslink material (DCM);
   performing a first baking process having a first baking temperature to the polymeric material layer, thereby initiating crosslinking function of the DCM; and
   performing a second baking process having a second baking temperature to the polymeric material layer, thereby initiating de-crosslinking function of the DCM, wherein the second baking temperature is greater than the first baking temperature.

2. The method of claim 1, further comprising forming a patterned resist layer on the polymeric material layer after the first baking process and before the second baking process.

3. The method of claim 2, wherein the forming of the patterned resist layer on the polymeric material layer includes
   coating the polymeric material with a resist material;
   performing an exposing process to the resist material; and
   developing the resist material, thereby forming the patterned resist layer.

4. The method of claim 2, further comprising performing an etching process to the polymeric material layer through openings of the patterned resist layer after the second baking process.

5. The method of claim 1, wherein the forming of the polymeric material layer on the substrate includes spin coating the polymeric material layer on the substrate.

6. The method of claim 1, wherein the polymeric material further includes polymeric backbones and a catalyst mixed with the DCM.

7. The method of claim 6, wherein the DCM includes
   a crosslink functional group;
   an acid labile group; and
   a chemical group chemically bonded to the crosslink functional group and the acid labile group.

8. The method of claim 7, wherein the performing of the first baking process includes performing the first baking process to the polymeric material layer with the first baking temperature high enough to crosslink the polymeric backbones and low enough to avoid de-crosslinking the polymeric backbones.

9. The method of claim 7, wherein the performing of the second baking process includes performing the second baking process at a temperature high enough to de-crosslink the polymeric backbones.

10. The method of claim 7, wherein the chemical group includes at least one of hydroxyl, carboxyl, amine, amide group, alkyl, fluoro, benzyl group, fluorine atom and alkyl fluoride.

11. The method of claim 7, wherein the DCM further includes an alkyl group having at least one of hydroxyl, carboxyl, amine, amide group, alkyl, fluoro, benzyl group, fluorine atom, alkyl fluoride and heteroatom.

12. A method for semiconductor fabrication, comprising:
   coating a polymeric material layer on a semiconductor substrate, wherein the polymeric material layer includes:
   polymeric backbones;
   de-crosslinkable crosslink material (DCM) being capable of crosslinking in a first baking process and de-crosslinking in a second baking process, wherein the DCM includes a crosslink functional group and an acid labile group (ALG) bonded together by a chemical group; and a catalyst that is capable of providing an acid environment to the ALG during the second baking process.

13. The method of claim 12, wherein the crosslink functional group is capable of crosslinking the polymeric backbones in response to the first baking process having a first baking temperature, and the acid labile group is functional to de-crosslink the polymeric backbones in response to the second baking process having a second baking temperature greater than the first baking temperature.

14. The method of claim 12, wherein the DCM includes

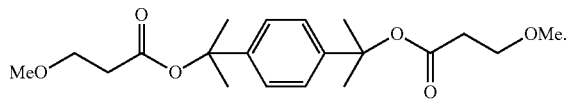 [SMILES: COCCC(=O)OC(C)(C)c1ccc(C(C)(C)OC(=O)CCOC)cc1]

15. A method, comprising:

forming a polymeric material layer on a semiconductor substrate, wherein the polymeric material layer includes de-crosslinkable cros slink material (DCM);

performing a first baking process having a first baking temperature to the polymeric material layer, thereby initiating crosslinking function of the DCM; and performing a second baking process having a second baking temperature to the polymeric material layer, thereby initiating de-crosslinking function of the DCM, the second baking temperature being greater than the first baking temperature, wherein the DCM includes a crosslink functional group; an acid labile group; and a chemical group chemically bonded with the crosslink functional group and the acid labile group.

16. The method of claim 15, further comprising forming a resist layer on the polymeric material layer.

17. The method of claim 16, further comprising patterning the polymeric material layer by using the resist layer as a mask.

18. The method of claim 17, wherein forming the resist layer on the polymeric material layer occurs after performing the first baking process and before performing the second baking process.

19. The method of claim 17, wherein the polymeric material layer further includes polymeric backbones and a catalyst mixed with the DCM.

20. The method of claim 19, wherein the DCM further includes an alkyl group having at least one of hydroxyl, carboxyl, amine, amide group, alkyl, fluoro, benzyl group, fluorine atom, alkyl fluoride and heteroatom.

* * * * *